US005621354A

United States Patent [19]

Mitzlaff

[11] Patent Number: 5,621,354

[45] Date of Patent: Apr. 15, 1997

[54] APPARATUS AND METHOD FOR PERFORMING ERROR CORRECTED AMPLIFICATION IN A RADIO FREQUENCY SYSTEM

[75] Inventor: James E. Mitzlaff, Arlington Heights, Ill.

[73] Assignee: Motorola, Inc., Schaumburg, Ill.

[21] Appl. No.: 544,221

[22] Filed: Oct. 17, 1995

[51] Int. Cl.[6] .......... H03F 3/66

[52] U.S. Cl. .......... 330/52; 330/149

[58] Field of Search .......... 330/52, 124, 149, 330/151; 375/297

[56] References Cited

U.S. PATENT DOCUMENTS

| | | | |
|---|---|---|---|
| 3,471,798 | 10/1969 | Seidel | 330/124 R |
| 3,649,927 | 3/1972 | Seidel | 330/124 R |
| 3,755,754 | 8/1973 | Putz | 330/149 |
| 3,815,040 | 6/1974 | Seidel | 330/149 |
| 3,873,936 | 3/1975 | Cho | 330/124 R |
| 3,922,617 | 11/1975 | Denniston et al. | 330/149 |
| 3,993,961 | 11/1976 | Narayanan | 330/149 |
| 4,458,209 | 7/1984 | Miller et al. | 330/141 |
| 4,517,521 | 5/1985 | Preschutti et al. | 330/2 |
| 4,580,105 | 4/1986 | Myer | 330/149 |
| 4,583,049 | 4/1986 | Powell | 330/151 |
| 4,629,996 | 12/1986 | Watanabe et al. | 330/151 |
| 4,636,741 | 1/1987 | Mitzlaff | 330/127 |
| 4,717,884 | 1/1988 | Mitzlaff | 330/151 |
| 4,879,519 | 11/1989 | Myer | 330/149 |
| 4,885,551 | 12/1989 | Myer | 330/52 |
| 4,926,136 | 5/1990 | Olver | 330/149 |
| 5,023,565 | 6/1991 | Lieu | 330/151 |
| 5,077,532 | 12/1991 | Obermann et al. | 330/151 |
| 5,130,663 | 7/1992 | Tattersall, Jr. | 330/52 |
| 5,155,448 | 10/1992 | Powell | 330/151 |
| 5,157,346 | 10/1992 | Powell et al. | 330/151 |
| 5,307,022 | 4/1994 | Tattersall, Jr. et al. | 330/52 |
| 5,307,512 | 4/1994 | Mitzlaff | 455/126 |
| 5,323,119 | 6/1994 | Powell et al. | 330/151 |
| 5,349,300 | 9/1994 | Matz et al. | 330/129 |
| 5,386,198 | 1/1995 | Ripstrand et al. | 330/52 |
| 5,444,418 | 8/1995 | Mitzlaff | 330/52 |
| 5,493,252 | 2/1996 | Takai | 330/52 |

OTHER PUBLICATIONS

Application to Federal Communications Commission for Equipment Authorization by Motorola, Inc.; FCC ID IHEC5UX1; File #31010/EQU 17.9. Application Date Apr. 28, 1995.

Application to Federal Communications Commission for Equipment Authorization by Motorola, Inc.; FCC ID IHEC5UJ1; File #31010/EQU 17.9. Application Date Nov. 2, 1994.

Application to Federal Communications Commission for Equipment Authorization by Motorola, Inc.; FCC ID IHEC55H1; File #31010/EQU 17.9. Application Date Apr. 24, 1992.

A Microwave Feed–Forward Experiment, H. Seidel, The Bell System Technical Journal, vol. 50, No. 9, Nov., 1971.

Analog Reflection Topology Building Blocks for Adaptive Microwave Signal Processing Applications, Lucyszyn and Robertson, IEEE, vol. 43, No. 3, Mar. 1995, pp. 601–611.

*Primary Examiner*—Steven Mottola
*Attorney, Agent, or Firm*—Jeffrey G. Toler

[57] ABSTRACT

An error corrected amplifier circuit (100) for use in a radio frequency system is provided. The error corrected amplifier circuit (100) includes a first pilot modulation stage (101) and a second pilot modulation stage (103). The first pilot modulation stage (101) creates a first amplified signal (129) having an error component and a first error signal (134) indicative of the error component. The second pilot modulation stage (103) receives the first amplified signal (129) and the error signal (134) and generates an error reduced amplified signal (158).

20 Claims, 4 Drawing Sheets

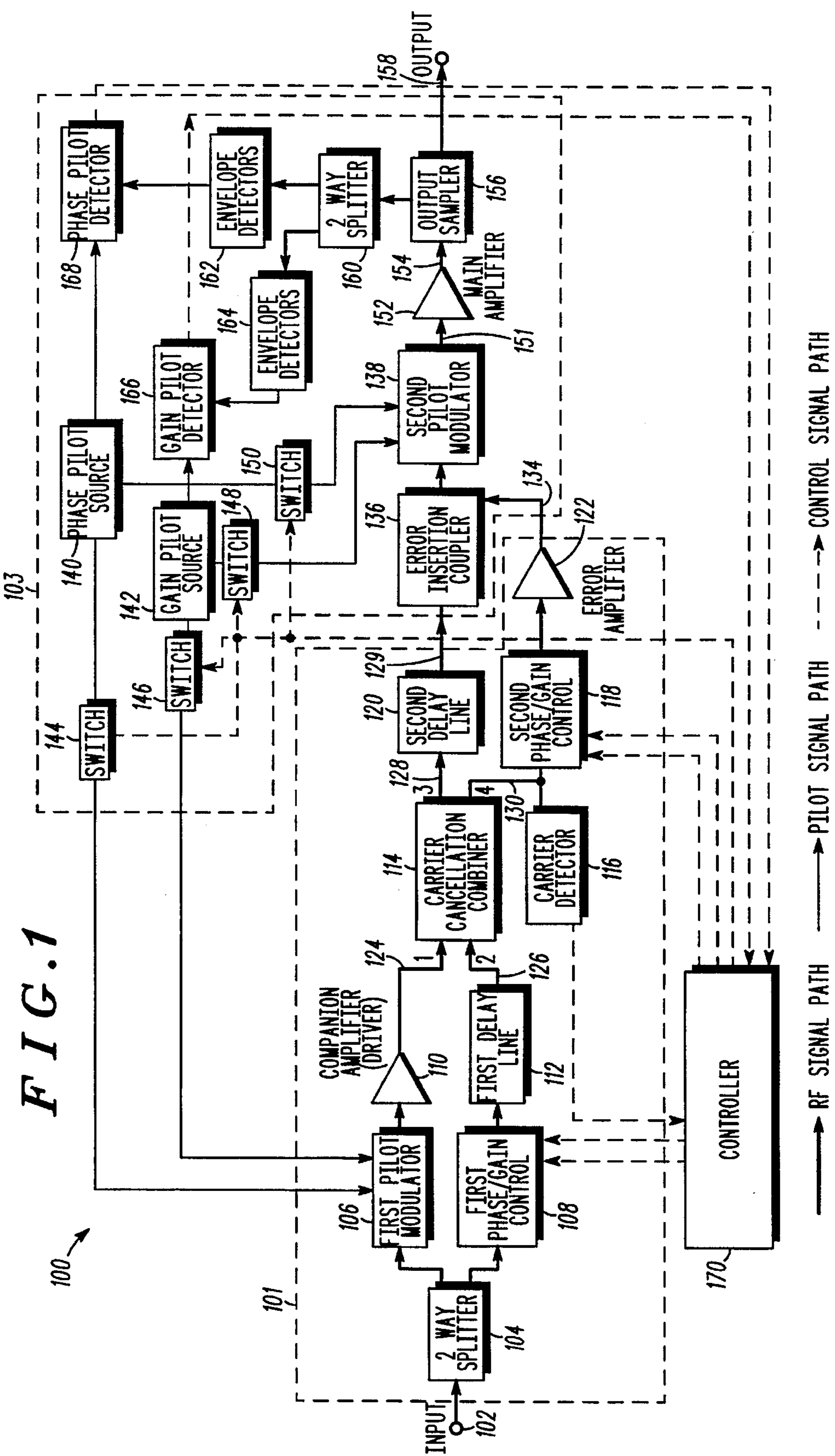
FIG. 1
100
INPUT
102
2 WAY SPLITTER
104
101
FIRST PILOT MODULATOR
106
FIRST PHASE/GAIN CONTROL
108
COMPANION AMPLIFIER (DRIVER)
110
FIRST DELAY LINE
112
124
126
1
2
CARRIER CANCELLATION COMBINER
114
CARRIER DETECTOR
116
3
4
128
130
SECOND DELAY LINE
120
129
SECOND PHASE/GAIN CONTROL
118
ERROR AMPLIFIER
122
ERROR INSERTION COUPLER
136
134
SECOND PILOT MODULATOR
138
151
MAIN AMPLIFIER
152
154
OUTPUT SAMPLER
156
OUTPUT
158
2 WAY SPLITTER
160
ENVELOPE DETECTORS
162
ENVELOPE DETECTORS
164
GAIN PILOT DETECTOR
166
PHASE PILOT DETECTOR
168
PHASE PILOT SOURCE
140
GAIN PILOT SOURCE
142
SWITCH
144
SWITCH
146
SWITCH
148
SWITCH
150
103
CONTROLLER
170
RF SIGNAL PATH
PILOT SIGNAL PATH
CONTROL SIGNAL PATH

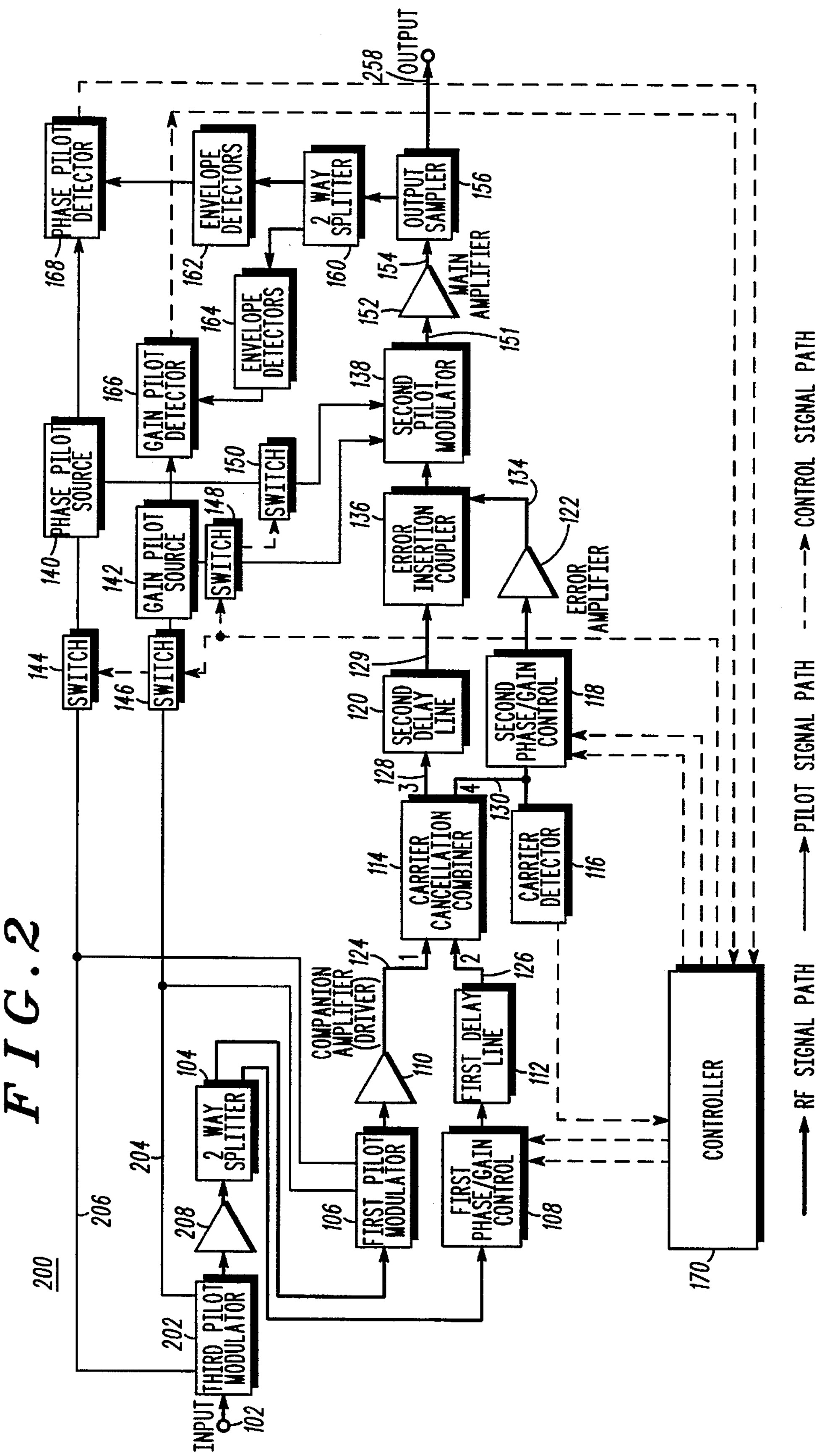
FIG. 2
200
INPUT
102
THIRD PILOT MODULATOR
202
208
2 WAY SPLITTER
104
204
206
FIRST PILOT MODULATOR
106
FIRST PHASE/GAIN CONTROL
108
COMPANION AMPLIFIER (DRIVER)
110
124
FIRST DELAY LINE
112
126
CARRIER CANCELLATION COMBINER
114
CARRIER DETECTOR
116
130
128
SECOND DELAY LINE
120
129
SECOND PHASE/GAIN CONTROL
118
ERROR AMPLIFIER
122
134
ERROR INSERTION COUPLER
136
SECOND PILOT MODULATOR
138
151
MAIN AMPLIFIER
152
154
OUTPUT SAMPLER
156
2 WAY SPLITTER
160
ENVELOPE DETECTORS
162
ENVELOPE DETECTORS
164
GAIN PILOT DETECTOR
166
PHASE PILOT DETECTOR
168
PHASE PILOT SOURCE
140
GAIN PILOT SOURCE
142
SWITCH
144
SWITCH
146
SWITCH
148
SWITCH
150
258
OUTPUT
CONTROLLER
170
RF SIGNAL PATH
PILOT SIGNAL PATH
CONTROL SIGNAL PATH

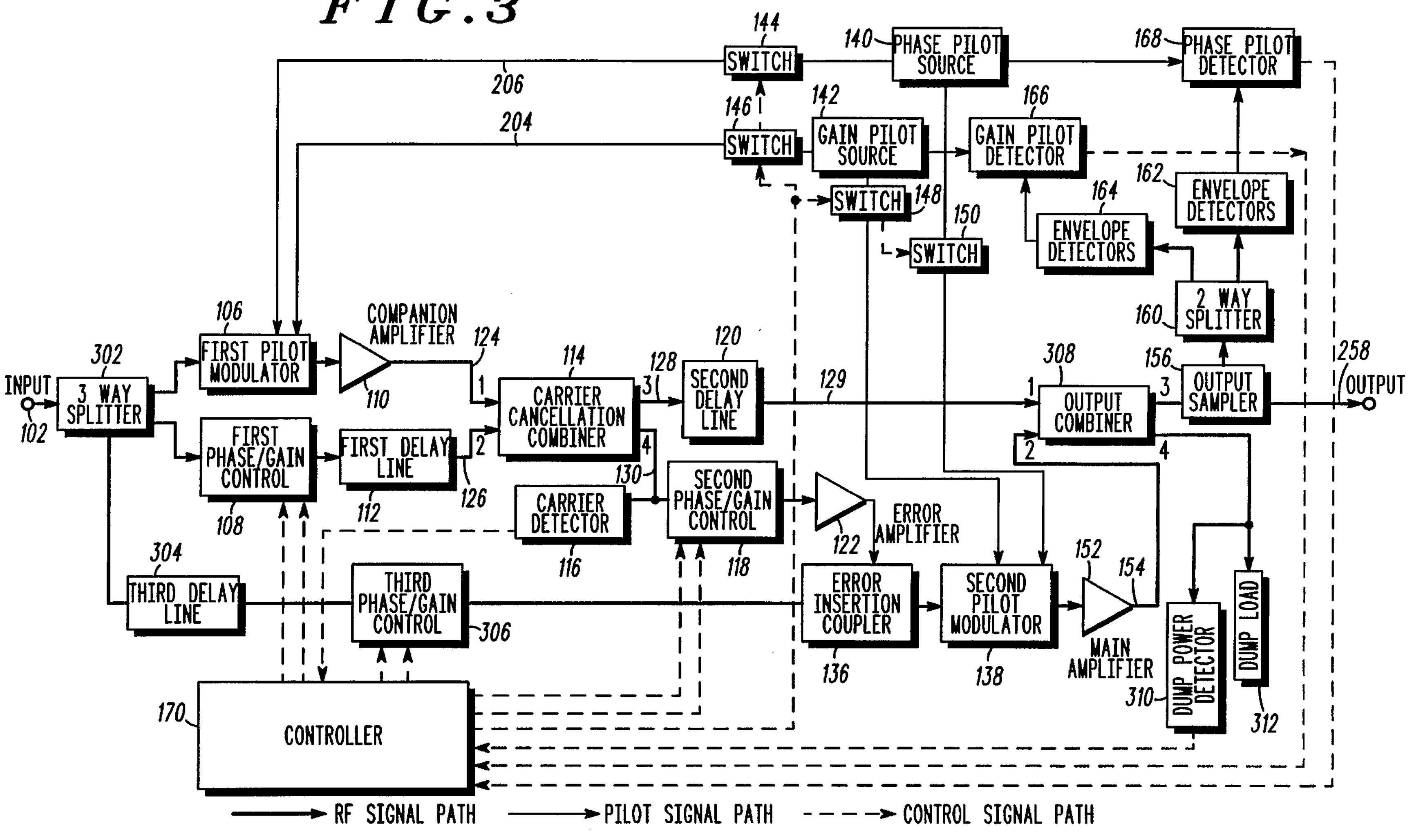
FIG. 3
INPUT
102
3 WAY SPLITTER
302
FIRST PILOT MODULATOR
106
FIRST PHASE/GAIN CONTROL
108
THIRD DELAY LINE
304
COMPANION AMPLIFIER
110
FIRST DELAY LINE
112
THIRD PHASE/GAIN CONTROL
306
CONTROLLER
170
124
126
CARRIER CANCELLATION COMBINER
114
CARRIER DETECTOR
116
128
130
SECOND DELAY LINE
120
SECOND PHASE/GAIN CONTROL
118
129
ERROR AMPLIFIER
122
ERROR INSERTION COUPLER
136
SECOND PILOT MODULATOR
138
MAIN AMPLIFIER
152
154
OUTPUT COMBINER
308
OUTPUT SAMPLER
156
DUMP POWER DETECTOR
310
DUMP LOAD
312
2 WAY SPLITTER
160
ENVELOPE DETECTORS
162
ENVELOPE DETECTORS
164
GAIN PILOT DETECTOR
166
PHASE PILOT DETECTOR
168
PHASE PILOT SOURCE
140
GAIN PILOT SOURCE
142
SWITCH
144
SWITCH
146
SWITCH
148
SWITCH
150
206
204
258
OUTPUT
RF SIGNAL PATH
PILOT SIGNAL PATH
CONTROL SIGNAL PATH

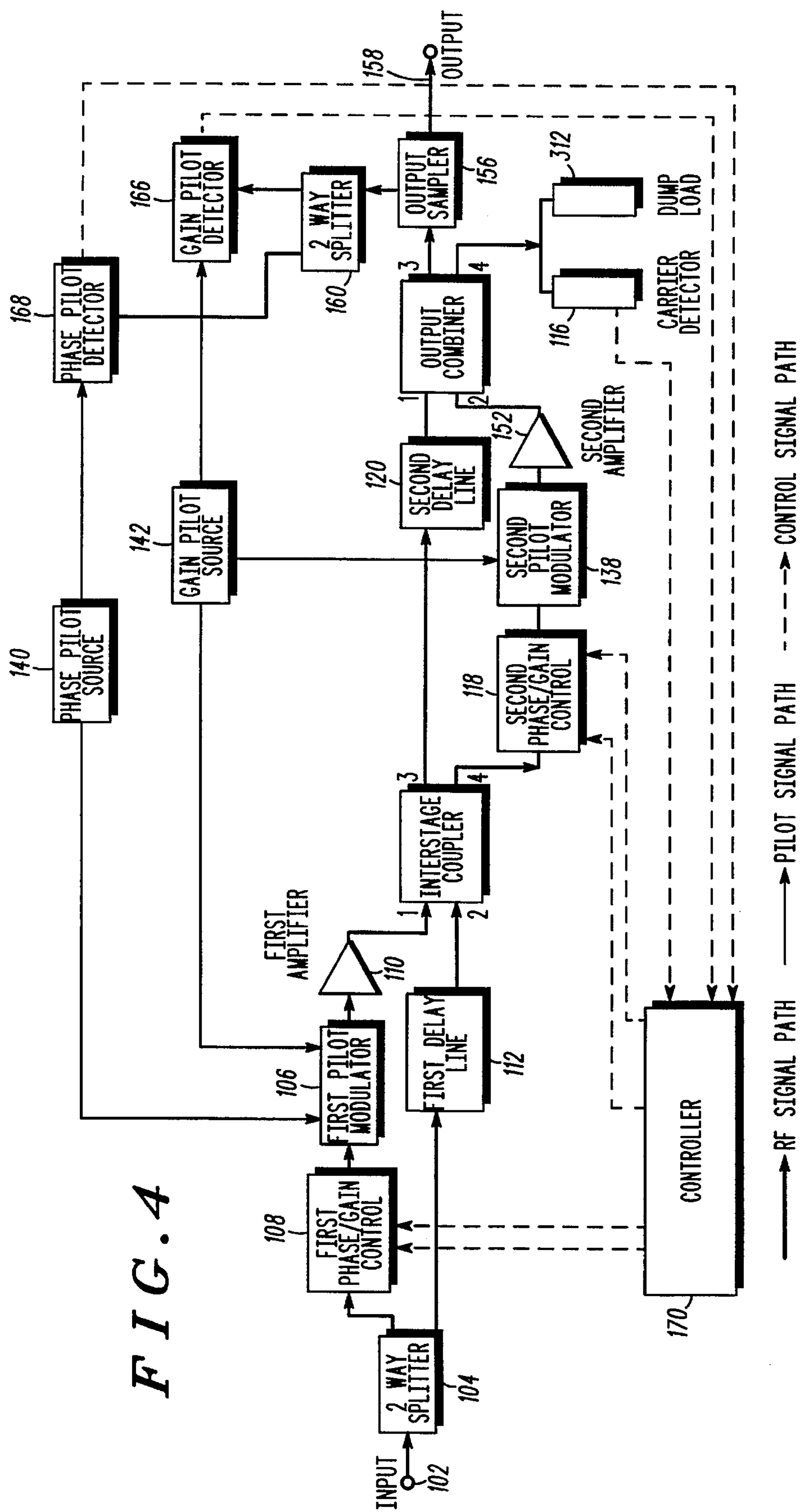
FIG. 4
INPUT
102
2 WAY SPLITTER
104
FIRST PHASE/GAIN CONTROL
108
FIRST PILOT MODULATOR
106
FIRST AMPLIFIER
110
FIRST DELAY LINE
112
INTERSTAGE COUPLER
SECOND PHASE/GAIN CONTROL
118
SECOND PILOT MODULATOR
138
SECOND AMPLIFIER
152
SECOND DELAY LINE
120
OUTPUT COMBINER
OUTPUT SAMPLER
156
OUTPUT
158
2 WAY SPLITTER
160
GAIN PILOT DETECTOR
166
PHASE PILOT DETECTOR
168
PHASE PILOT SOURCE
140
GAIN PILOT SOURCE
142
CARRIER DETECTOR
116
DUMP LOAD
312
CONTROLLER
170
RF SIGNAL PATH
PILOT SIGNAL PATH
CONTROL SIGNAL PATH

APPARATUS AND METHOD FOR PERFORMING ERROR CORRECTED AMPLIFICATION IN A RADIO FREQUENCY SYSTEM

CROSS REFERENCES

This application is related to commonly assigned copending U.S. patent application Ser. No. 08/282298, filed Jul. 29, 1994 by James E. Mitzlaff and commonly assigned copending U.S. patent application Ser. No. 08/332163, filed Oct. 31, 1994 to John E. Matz, the entire contents of each of these applications is incorporated herein by this reference.

FIELD OF THE INVENTION

This invention relates generally to amplifiers for use in radio frequency (RF) systems, and more particularly to error corrected amplifiers for use in an RF system.

BACKGROUND OF THE INVENTION

In radio frequency (RF) system applications, such as cellular and microwave communication system applications, where multiple carrier input signals are fed into an RF power amplifier, the amplifier's inherent nonlinear characteristics at higher power levels generally cause the amplifier output to contain undesirable intermodulation (IM) products. These IM products may cause undesirable interference and crosstalk over the operative amplifier frequency range. In addition, the IM products may exceed transmission standards for RF equipment.

One conventional method of reducing IM products uses a "spectral analysis" approach and is described in U.S. Pat. No. 4,879,519. The "spectral analysis" approach involves scanning the output of the amplifier using a receiver tuned to the frequency of candidate IM products. The IM level for a candidate IM product is read by the scanner, and a linearizer is adjusted to minimize the IM product. This procedure of reading the level of the IM product and adjusting to minimize the IM product is repeated until each of the IM products has a level below a predetermined acceptable level.

Although this conventional method reduces IM products, the method requires the scanner to iteratively search for the IM products and therefore has a slow convergence interval due to the time required to scan and find the IM products. In addition, this method requires sophisticated spectral analysis equipment which adds significant cost to the amplifier.

Accordingly, there is a need for a method and apparatus for amplifying multiple carrier input signals with a faster convergence time and reduced cost while still reducing IM products in an RF system.

SUMMARY OF THE INVENTION

According to an aspect of the present invention, an apparatus and a method for performing error corrected amplification in a radio frequency system is provided. The apparatus is an error corrected amplifier circuit including a first pilot modulation stage and a second pilot modulation stage. The first pilot modulation stage creates a first amplified signal having an error component and a first error signal indicative of the error component. The second pilot modulation stage receives the first amplified signal and the error signal and generates an error reduced amplified signal.

Preferably, the first pilot modulation stage comprises a pilot modulation circuit and an amplifier responsive to the pilot modulation circuit. The pilot modulation circuit preferably includes a phase and gain control circuit and a pilot modulator coupled to the phase and gain control circuit. In a preferred embodiment, the pilot modulator is driven by a phase pilot source and a gain pilot source.

The second pilot modulation stage preferably includes an error insertion coupler, a second pilot modulator responsive to the error insertion coupler, and a main amplifier responsive to the second pilot modulator. The error insertion coupler receives the first amplified signal and the error signal, and the main amplifier generates the error reduced output signal.

According to another aspect of the invention, the error correcting amplifier circuit includes an amplifier, a phase pilot source, a gain pilot source, a pilot modulator coupled to the amplifier, and a first on/off switch. The on/off switch selectively couples the pilot modulator and at least one of the pilot sources. Preferably, the first on/off switch is used to perform DC offset compensation.

The method of performing error corrected amplification includes a method of aligning the error correcting amplifier circuit. According to a preferred embodiment, the method includes the steps of providing a first amplifier having inherent distortion characteristics, providing a second amplifier having substantially similar distortion characteristics as the first amplifier, setting a first phase and gain control circuit in response to a power level detected by a carrier detector which is responsive to the first amplifier, and setting a second phase and gain control circuit in response to the output of a pilot detector which is responsive to the second amplifier to produce an error signal which is out of phase from the output of the first amplifier.

The invention itself, together with its intended advantages will best be understood by reference to the following detailed description, taken in conjunction with the accompanying drawings.

BRIEF DESCRIPTION OF THE DRAWINGS

FIG. 1 is a block circuit diagram illustrating a preferred embodiment of an error correcting amplifier circuit according to the present invention.

FIG. 2 is a block circuit diagram illustrating a second preferred embodiment of an error correcting amplifier circuit according to the present invention.

FIG. 3 is a block circuit diagram illustrating a third preferred embodiment of an error correcting amplifier circuit.

FIG. 4 is a block circuit diagram illustrating a fourth preferred embodiment of an error correcting amplifier circuit.

DETAILED DESCRIPTION OF THE PREFERRED EMBODIMENTS

Referring to FIG. 1, a preferred embodiment of an error corrected amplifier circuit is illustrated. The error correction amplifier circuit 100 includes a first pilot modulation stage 101 and a second pilot modulation stage 103. The first pilot modulation stage 101 includes a first pilot modulator 106, a first phase and gain control circuit 108, a companion amplifier 110, a first delay line 112, a carrier cancellation combiner 114, a carrier detector 116, a second phase and gain control circuit 118, a second delay line 120 and an error amplifier 122. The first pilot modulation stage 101 also includes a two way splitter 104 which receives an input signal from an input node 102.

The second pilot modulation stage 103 includes an error insertion coupler 136, a second pilot modulator 138, a main amplifier 152, an output sampler 156, and envelope detectors 162 and 164. The second pilot modulation stage 103 also includes a gain pilot detector 166, a phase pilot detector 168, a phase pilot source 140, and a gain pilot source 142. The second pilot modulation stage 103 also preferably includes DC compensation on/off switches 144, 146, 148 and 150. In addition to the first and second pilot modulation stages, the amplifier circuit 100 also includes a controller 170 coupled to the first and second pilot modulation stages 101, 103.

During operation, an input signal is received at input node 102 and fed into the two way splitter 104. The splitter 104 provides a first signal fed into the first pilot modulator 106 and a second signal that is substantially identical to the first signal which is fed into the first phase and gain control circuit 108. In the first pilot modulator 106, an amplitude modulator is driven by the gain pilot source 142, and a phase modulator is driven by the phase pilot source 140. The output from the first pilot modulator 106 is fed into the companion amplifier 110.

Distortion products produced by the companion amplifier 110 are isolated by the carrier cancellation combiner 114, amplified by the error amplifier 122, and re-inserted by the error insertion coupler 136 such that the signal at the output of the error insertion coupler 136 has distortion products which are preferably equal in amplitude related to the carriers, but out of phase from the distortion products present at the output of the companion amplifier 110. This preferred configuration is designed to cancel the distortion produced by the main amplifier 152, assuming that its distortion characteristics are substantially identical to those of the companion amplifier 110.

The first phase and gain control circuit 108 is controlled by the controller 170 and produces an output signal which is delayed by first delay line 112 and then fed into the second port of the carrier cancellation combiner 114. The companion amplifier 110 produces an amplified signal 124 which is in turn fed into the first port of the combiner 114. The combiner 114 produces a first output signal 128 at a third port and a second output signal 130 at a fourth port.

The first output signal 128 has an error component which is generally caused by IM products from amplification within the amplifier 110. The second output signal 130 has an error component which is representative of the IM products produced by amplifier 110 and a residual carrier signal component. Carrier detector 116 receives the second output signal 130 and detects the residual carrier signal component in the output signal 128 that has not been removed by the combiner 114. The first phase and gain control circuit 108, is adjusted by controller 170 so as to minimize this residual carrier signal component.

The second phase and gain control circuit 118 receives the second output signal 130 and responds to control signals from controller 170. The second phase and gain control circuit 118, in response to control information from the controller 170, produces a signal 132 which is indicative of the error component in the first output signal 128. The signal 132 is then amplified by the error amplifier 122 to produce an error signal 134.

The output signal 128 is delayed by the second delay line 120 to produce a first amplified signal 129. The first amplified signal 129 has an error component due to distortion characteristics of the amplifier 110. Error insertion coupler 136 receives the first amplified signal 129 and the error signal 134 and produces a combined signal.

In the preferred embodiment the controller 170 includes a microprocessor, such as a Motorola 68030 processor, that is programmed to control the second phase and gain control circuit 118 so that after passing through error insertion coupler 136, the error signal 134 has an amplitude twice as great as the amplitude of the error component in the first amplified signal 129. In addition, the error signal 134 is out of phase, preferably 180° out of phase, from the error component in the first amplified signal 129.

The second pilot modulator circuit 138 receives the combined signal from the error insertion coupler 136 and applies a pilot modulation signal from the phase pilot source 140 and the gain pilot source 142 to produce a pilot modulated output signal 151. The output signal 151 from the second pilot modulator 138 is amplified by the main amplifier 152 to create an output amplified signal 154. The output amplified signal 154 is sampled by output sampler 156 and then provided as an error reduced amplified signal 158 at the output of the error corrected amplifier circuit 100.

A sampled signal from the output sampler 156 is split into two paths by the two-way splitter 160. A first path is fed into the envelope detector 162 and a second path is fed into the envelope detector 164. The first path includes the phase pilot detector 168 and the second path includes the gain pilot detector 166. The phase pilot detector 168 and the gain pilot detector 166 each receive an input from the phase and gain pilot sources 140 and 142 respectively. The phase and gain pilot detectors 168 and 166, each provide a control signal containing detected phase and gain pilot signal information for use by the controller 170. The controller 170 responds to detected signal information from pilot detectors 166 and 168 to reduce IM products in the output signal 158 by adjusting the second phase/gain control circuit 118.

An additional feature of the circuit 100 is the provision for the controller driven on/off switches 144, 146, 148, 150 in all pilot signal lines going to the pilot modulators 106, 138. The controller 170 has the ability to "null out" any DC offsets in the pilot detectors 166, 168 by sampling their outputs when the modulation inputs to the pilot modulators 106, 138 have been turned off by the appropriate on/off switch. The controller 170 then subtracts a measured residual DC offset signal from the pilot detector outputs when pilot modulation is turned back on. Of course, the same effect could also be achieved by placing the DC compensation switches 144, 146, 148, 150 in the lines between the envelope detector outputs and the pilot detector inputs, or providing a means to "ground" the pilot detector inputs that are connected to the envelope detector outputs.

FIG. 2 illustrates another preferred embodiment of an amplifier circuit 200 having a preamplifier 208. The amplifier circuit 200 has been slightly modified in comparison to the amplifier circuit 100 of FIG. 1 and only the differences will be described. Between the input 102 and the two way splitter 104 of FIG. 1, a third pilot modulator 202 driven by first and second pilot control lines 206 and 204 from the phase and gain pilot sources 140 and 142 is coupled to the preamplifier 208. The preamplifier 208 is preferably chosen to have substantially similar distortion characteristics as the companion amplifier 110. In this manner the controller 170 may compensate for distortion in the third amplifier 208 based on the output of the pilot detectors 166 and 168 as described above with respect to FIG. 1.

A person of ordinary skill in the art will appreciate and understand that many additional amplifiers may be added to the amplifier circuits shown in FIG. 1, such as the preamplifier 208 of FIG. 2. Although multiple amplifiers may be used, it is important to note that each amplifier is preferably coupled with a pilot modulator circuit, such as the pilot modulator 202 in FIG. 2. In addition, in the preferred embodiment each amplifier has substantially similar distortion characteristics. Where each of the amplifiers has substantially similar distortion characteristics, the controller 170 may more accurately determine the correct amplitude and phase of the error signal 134 inserted at the error coupler 136. However, even if the amplifiers have different distortion characteristics, the controller 170 may be programmed to adjust the various phase and gain control circuits connected to each of the amplifiers to compensate for these variations.

Another aspect of the present invention provides a method for automatically adjusting the phase and gain controls 108 and 118 so that the amplitude and phase of the error signal 134 cancels distortion produced by the main amplifier 152. In the preferred alignment method, the first phase and gain control 108 is set to minimize the carrier power present in the second output signal 130. This may be an automatic, adaptive process, as indicated in FIG. 1., where the controller 170 continuously updates the settings of the first phase/gain control 108 in order to minimize the power detected by the carrier detector 116. Carrier cancellation may also be just a simple, one-time adjustment. The latter approach may be preferred in some applications, since this system is tolerant of small amounts of carrier power in the second output signal 130, provided that the error amplifier 122 is large enough to handle the resulting signal without contributing any significant distortion of its own.

Those skilled in the art will appreciate that the step of adjusting the first phase and gain control 108 is primarily used to compensate for drifts in the gain and phase shift of the companion amplifier 110. If these problems are not too severe, this step may be omitted without negatively impacting system performance.

The phase adjuster within the second phase and gain control 118 is then adjusted to minimize the output of the phase pilot detector 168. Likewise, the gain adjuster within the second phase and gain control 118 is adjusted to minimize the output of the gain pilot detector 166. The above steps are then repeated until no further improvements are seen in pilot cancellation. The output of the second pilot modulator 138 is then set to "simulate" the distortion produced by the main amplifier 152.

The second pilot modulator 138 allows the circuit 100 to align itself so that the modulation sidebands produced by the first pilot modulator 106 appear at the output of the error insertion coupler 136 with the same amplitude relative to the carriers, but 180° out of phase from the modulation sidebands present at the output of the first pilot modulator 106. These modulation sidebands will preferably be "canceled" at the output of the second pilot modulator 138 by the modulation sidebands produced within the second pilot modulator 138 itself. In the preferred embodiment, the pilot modulator and amplifier components are selected to approximate the following theoretically ideal conditions:

1. All pilot modulators produce no IMD by themselves.
2. All pilot modulators have identical modulation characteristics.
3. All pilot modulators immediately precede their respective amplifiers in the signal path.
4. The gain pilot signal has the same magnitude and phase at each modulator
5. The phase pilot signal has the same magnitude and phase at each modulator.
6. Both the main and companion amplifiers have identical distortion characteristics.

The above theoretical considerations highlight the importance of designing the system such that each pilot modulator accurately simulates the distortion characteristics of its associated amplifier.

In practice, it is unlikely that both the main amplifier 152 and the companion amplifier 110 will have identical distortion characteristics. This is not a problem, so long as the difference is reasonably small and repeatable (or at least stable vs. time and temperature). In this case, there are slight differences in the pilot signals supplied to each pilot modulator and the gain pilot amplitudes are adjusted to compensate for differences in gain compression between the two amplifiers. For example, the gain pilot signal supplied to the second pilot modulator 138 may be increased if the main amplifier 152 has more gain compression than the companion amplifier 110. Likewise, the phase pilot amplitudes may be adjusted to compensate for differences in amplitude to phase modulation conversion. This pilot amplitude adjustment is preferably performed only once, either as part of the amplifier design process, as part of the final tune-up procedure performed on each amplifier design process, or as part of the final tune-up procedure performed on each amplifier in the factory.

Referring now to FIG. 3, an alternative preferred embodiment is illustrated. This embodiment is preferred over the system of FIG. 1 in some applications, such as applications where the companion amplifier will be driven to the same power level as the main amplifier. This approach can give better error cancellation than the previous two embodiments because two amplifiers of the same power level can have more closely matched distortion characteristics than two amplifiers of differing power levels. In order to operate efficiently, however, the power output from the companion amplifier 110 must be summed in phase with the output from the main amplifier 152, so that both amplifiers contribute equally to the system output 258.

The system shown in FIG. 3 provides a means for performing this power summation by first adding a three way splitter 302 to create a third input signal path including third delay line 304 and third gain and phase control 306 to drive the second pilot modulator 138. The error insertion coupler 136 is placed along the third input signal path and is connected between the third phase and gain control 306 and the second pilot modulator 138. The output 129 from the second delay line 120 is fed into an output combiner 308 so that it can be added to the main amplifier output 154.

During initial system design, the delay of the third delay line 304 is chosen to match the delay from the input splitter 302 to the output of the error amplifier 122. During the alignment process, the third phase and gain control 306 is adjusted so as to minimize the signal from a dump port detector 310, thereby minimizing the power wasted in a dump port 312 connected to the output combiner 308. This forces the companion and main amplifiers 110, 152 to operate substantially in phase at nearly the same power level (the power levels will be truly identical if there were no power lost in the carrier cancellation combiner and the second delay line). The adjustment of the third phase and gain control 306 is normally done between the adjustments of the first 108 and second 118 phase and gain controls.

Another preferred embodiment is provided in FIG. 4. This system is similar to FIG. 3, in that it is used in situations where both companion and main amplifiers have nearly the same power output capability. The main difference is that FIG. 4 does away with the second signal path (error amplifier and associated blocks) in FIG. 3, but at the expense of a more complicated alignment procedure, as indicated below.

1. The first step is to pre-align the system as a conventional type 2 feedforward loop. This can be accomplished by turning off the second pilot modulator, then following the alignment procedure outlined in copending U.S. patent application Ser. No. 08/282298.
2. Turn the second pilot modulator back on.
3. Repeat the following steps in sequence
   - 3a. Adjust the first and second gain controls together and in the same direction to null out the detected gain pilot signal.
   - 3b. Adjust the first phase control, if necessary, to null out the detected phase pilot signal.
   - 3c. Adjust the second gain and phase controls to minimize the power delivered to the dump load.

It should be noted that step 3b is only needed to compensate for incidental phase shifts in the gain adjusters and amplitude modulation (AM)/phase modulation (PM) conversion in the amplifier stages. If these problems are not too severe, step 3b may be omitted without impacting the final (post-alignment) system performance. This is because, theoretically, gain balancing is the only difference between a straight type 2 feedforward loop, and one that uses predistortion for additional error correction.

Those skilled in the art will understand that the above described method and apparatus is operative to amplify multicarrier input signals to produce an amplified output and reduces IM products. In addition, the preferred embodiments advantageously perform this desirable function without using expensive spectral analysis equipment and without a slowly converging iterative process.

Further advantages and modifications of the above described apparatus and method will readily occur to those skilled in the art. The invention, in its broader aspects, is therefore not limited to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What is claimed is:

1. An amplifier circuit for use in a radio frequency system comprising:

a first pilot modulation stage creating a first amplified signal having an error component and an error signal indicative of the error component, said first pilot modulation stage comprising:

a signal splitter receiving an input signal and generating a, first and second input signal;

a Pilot modulator coupled to said signal splitter and receiving the first input signal;

a phase and gain control circuit coupled to said signal splitter and receiving the second input signal;

an amplifier responsive to the pilot modulator; and a coupler responsive to said amplifier and responsive to said phase and gain control circuit, said coupler generating said first amplified signal; and a second pilot modulation stage receiving the first amplified signal and the error signal and generating an error reduced amplified signal.

2. The amplifier circuit of claim 1, wherein said pilot modulator is driven by a pilot source.

3. The amplifier circuit of claim 1, wherein the first and second input signals are substantially the same.

4. The amplifier circuit of claim 1, wherein said coupler receives a delayed signal produced by passing the second input signal through a time delaying circuit.

5. The amplifier circuit of claim 1, wherein said first pilot modulation stage further comprises a second gain and phase control circuit in communication with said coupler and an error amplifier coupled to the second gain and phase control circuit and generating said error signal.

6. The amplifier circuit of claim 1, wherein said phase and gain control circuit is in communication with a programmable controller.

7. The amplifier circuit of claim 1, wherein said pilot modulator is driven by a phase pilot source and a gain pilot source.

8. The amplifier circuit of claim 6, further comprising a switch coupled to said pilot modulator.

9. The amplifier circuit of claim 1, wherein the second pilot modulation stage comprises:

an error insertion coupler receiving said first amplified signal and said error signal;

a second pilot modulator responsive to said error insertion coupler; and a main amplifier responsive to said second pilot modulator, said main amplifier generating said error reduced amplified signal.

10. The amplifier circuit of claim 9, wherein said second pilot modulator is driven by at least one pilot source.

11. The amplifier circuit of claim 10, wherein said second pilot modulator is coupled to a switch.

12. The amplifier circuit of claim 1, wherein said radio frequency system comprises a communication system.

13. The amplifier circuit of claim 12, wherein said communication system comprises one of a cellular system and a microwave system.

14. The amplifier circuit of claim 13, wherein said cellular system is a CDMA system.

15. The amplifier circuit of claim 1, further comprising a third pilot modulator and a third amplifier coupled to said first pilot modulation stage.

16. An error correcting radio frequency amplifier circuit comprising:

an amplifier;

a phase pilot source;

a gain pilot source;

a pilot modulator coupled to the amplifier;

a first on/off switch selectively coupling the pilot modulator and the phase pilot source; and a second on/off switch selectively coupling the pilot modulator and the gain pilot source.

17. The amplifier of claim 16, wherein said first on/off switch is used to perform DC offset compensation.

18. An amplifier circuit for use in a radio frequency system comprising:

a first pilot modulation stage creating a first amplified signal having an error component and an error signal indicative of the error component; and a second pilot modulation stage receiving the first amplified signal and the error signal and generating an error reduced amplified signal, the second pilot modulation stage comprising:

an error insertion coupler receiving said first amplified signal and said error signal;

a second pilot modulator responsive to said error insertion coupler; and a main amplifier responsive to said second pilot modulator, said main amplifier generating said error reduced amplified signal.

19. An amplifier circuit for use in a radio frequency system comprising:

a first pilot modulation stage creating a first amplified signal having an error component and an error signal indicative of the error component;

a second pilot modulation stage responsive to the first amplified signal and the error signal and generating an error reduced amplified signal; and a third pilot modulator and a third amplifier coupled to said first pilot modulation stage.

20. The amplifier of claim 19, wherein the third pilot modulator and the third amplifier are directly coupled to said first pilot modulation stage.

* * * * *